US005721606A

United States Patent [19]
Jain

[11] Patent Number: 5,721,606
[45] Date of Patent: Feb. 24, 1998

[54] LARGE-AREA, HIGH-THROUGHPUT, HIGH-RESOLUTION, SCAN-AND-REPEAT, PROJECTION PATTERNING SYSTEM EMPLOYING SUB-FULL MASK

[76] Inventor: Kanti Jain, 18 Algonquian Trail, Briarcliff Manor, N.Y. 10510

[21] Appl. No.: 524,706

[22] Filed: Sep. 7, 1995

[51] Int. Cl.⁶ .................................................. H01L 21/027
[52] U.S. Cl. .................................................. 355/53; 255/77
[58] Field of Search .................................. 355/50, 53, 54, 355/55, 60, 72, 75

[56] References Cited

U.S. PATENT DOCUMENTS

| | | | |
|---|---|---|---|
| 4,708,466 | 11/1987 | Isohata et al. | 355/53 |
| 5,150,152 | 9/1992 | Isohata et al. | 355/53 |
| 5,285,236 | 2/1994 | Jain | 355/53 |

Primary Examiner—John H. Pendegrass
Attorney, Agent, or Firm—Carl C. Kling

[57] ABSTRACT

For high-throughput, low-cost manufacturing of electronic modules, it is desirable to use a large-format, 1:1-imaging exposure system. In such a system, it is further desirable to have the capability to pattern a large substrate having multiple segments using a mask of the size of one substrate segment. The substrate is mounted on an x-y stage which moves the substrate with respect to the imaging optics, both within a segment and from segment to segment. For each mask position, moving from one substrate segment to another will result in a significant change in the length or orientation of the optical imaging path. Such problems are eliminated by using, in conjunction with the primary x-y stage, an auxiliary stage which maintains the optical parameters essentially constant for the imaging of different substrate segments. The auxiliary stage in a first embodiment is mounted on the primary x-y stage and is deployed to move the mask to compensate for the primary stage motion required to present the subsequent substrate segment at the imaging location and keep the optical parameters constant. In a second embodiment, the auxiliary stage is configured as an optics stage set mounted orthogonally to the x-y stage and moves components of the projection system to present a different substrate segment at the imaging location while keeping the optical imaging parameters constant. A third embodiment employs auxiliary stages for moving both the mask and the projection optics for greater versatility.

22 Claims, 5 Drawing Sheets

LARGE-AREA, HIGH-THROUGHPUT, HIGH-RESOLUTION, SCAN-AND-REPEAT, PROJECTION PATTERNING SYSTEM EMPLOYING SUB-FULL MASK

FIELD OF THE INVENTION

This invention relates to lithography systems for exposing large substrates at high imaging resolution and high exposure throughputs, and specifically relates to a scan-and-repeat patterning system that enables unit-magnification projection imaging of a large substrate using a mask that is smaller than the size of the substrate, while preserving the optical imaging parameters despite neccessary changes in the distance between mask and substrate.

BACKGROUND OF THE INVENTION

This inventor has previously disclosed a variety of large-area patterning systems (U.S. Pat. Nos. 4,924,257; 5,285,236 and 5,291,240). In these previous inventions, the inventor has disclosed projection imaging apparatus for producing very high-resolution patterns for integrated-circuit fabrication on a silicon-wafer-size (a few tens of sq. inches) substrate using reduction imaging with a mask that is larger than an individual integrated circuit, and apparatus for producing patterns on a large, display-panel-size (a few hundred sq. inches) substrate using 1:1 imaging with a mask that is of the same size as the substrate. Due to reasons of economies of scale, there are many other applications, such as multi-chip module fabrication, which would benefit by a high-throughput, 1:1 projection patterning system on a large substrate capable of accommodating multiple (4–20) modules. However, 1:1 imaging systems require a mask that is of the same size as the substrate. The high cost of large masks is a disadvantage of 1:1 patterning systems. Thus, it will be highly desirable to develop an apparatus that can exploit the benefits of 1:1 large-area projection imaging, and at the same time, requires a mask that is significantly smaller than the substrate. This invention describes such an apparatus.

There are a number of techniques for providing alignment to microelectronics exposure devices. Several such techniques are described in the prior art section of U.S. Pat. No. 5,150,152, Isohata et al., EXPOSURE APPARATUS INCLUDING DEVICE FOR DETERMINING MOVEMENT OF AN OBJECT, Sep. 22, 1992. Isohata et al. provide an improved inclination-error-correction for the alignment mechanism in a previously-known system. The system uses separate mask stage and substrate stage mounted in-line in a cage on a sliding carriage. The sliding carriage provides a scanning motion as it slides between guide rails called "LAB assemblies," but the carriage is subject to inclination error (theta changes from nominal) as a result of yaw from weight distribution and other dynamics. Isohata et al. provide an improved aligner, using a number of interferometer receivers, mounted on the carriage, together with a reference interferometer receiver mounted on the base, to detect and quantify the inclination error which it desires to correct. The actual inclination-error correction is made by a slight rotation resulting from a slight differential position change. The slight differential position change is imparted to the two sides of the carriage prior to start of scan, or by slight differential feed on the two sides of the carriage during scan.

The Isohata et al. emphasis on inclination error differs from the emphasis in the invention of this patent application, where inclination error is not a matter of major concern because mask and substrate are carried together on an integral stage platform for simultaneous scanning. The matter of major concern in this patent application, rather, is to maintain optical parameters constant between selected mask panel and selected substrate segment despite mask/substrate relationship changes. The required repositioning of substrate (and sometimes also of mask) for high-speed overlapping complementary scanning of a new segment of the substrate will usually cause one or more optical parameter changes, particularly changes in optical path length. Since in this patent application the mask and substrate are mounted in the same plane on a common platform, such optical parameter changes will in most cases result from changes in the distance between the selected mask and the selected substrate segment. This invention provides for compensating moves of one or more of mask, substrate and optics, to return the optical path length to nominal length. Isohata et al. do not have the problem of changing optical path length since the straight-through optics remain fixed. Isohata et al., not having the problem, do not provide or suggest any solution to the problem.

SUMMARY OF THE INVENTION

For high-throughput, low-cost manufacturing of a variety of electronic modules, it is desirable to use a large-format exposure system with a 1:1 imaging ratio. In such a system, it is further desirable to have the capability to pattern a large substrate consisting of multiple segments using a mask that is of the size of one substrate segment. The substrate is mounted on an x-y stage which moves the substrate with respect to the imaging optics, both within each segment and from one segment to another segment. For a given mask position, moving from one substrate segment to another will result in a significant change in the length or orientation of the optical imaging path. Such problems are eliminated by using, in conjunction with the primary x-y stage, an auxiliary stage which maintains the optical parameters, essentially constant for the imaging of different substrate segments. The auxiliary stage in a first embodiment is mounted on the primary x-y stage and is deployed to move the mask to compensate for the primary stage motion required to present the subsequent substrate segment at the imaging location and keep the optical parameters constant. In a second embodiment, the auxiliary stage is configured as an optics stage set mounted orthogonally to the x-y stage and moves components of the projection system to present a different substrate segment at the imaging location while keeping the optical imaging parameters constant. A third embodiment employs auxiliary stages for moving both the mask and the projection optics for greater versatility.

It is an object of the invention to provide a projection patterning system of unit magnification for imaging a multi-segment substrate using a single-segment-size mask repeatedly, while preserving the optical imaging parameters.

Another object of the invention is to provide the capability to image different masks on different segments of a large substrate.

A feature of the invention is the incorporation of auxiliary stages which alter the position of the mask or the positions of the components of the imaging optics to preserve the optical imaging parameters of the patterning system despite necessary changes in the distance between the mask and the selected substrate segment.

Another feature of the invention is its ability to combine the movements of multiple auxiliary stages to alter the positions of both the mask and the imaging optics components so as to preserve the system imaging parameters for patterning of different substrate segments.

An advantage of the invention is that a single-segment mask may be repeatedly used to provide exposure patterns for a substrate of multiple segments, with optical parameters remaining constant, so that high throughput and seamless imaging are achieved over a large substrate, thereby providing economies of scale.

Another advantage of the invention is that benefits of large-format processing and 1:1 imaging are realized without the disadvantage of high cost of large masks.

Other objects, features and advantages of the invention will be apparent to those skilled in the art upon reading the following text and viewing the following drawings.

DETAILED DESCRIPTION OF THE EMBODIMENTS

Figure 1:
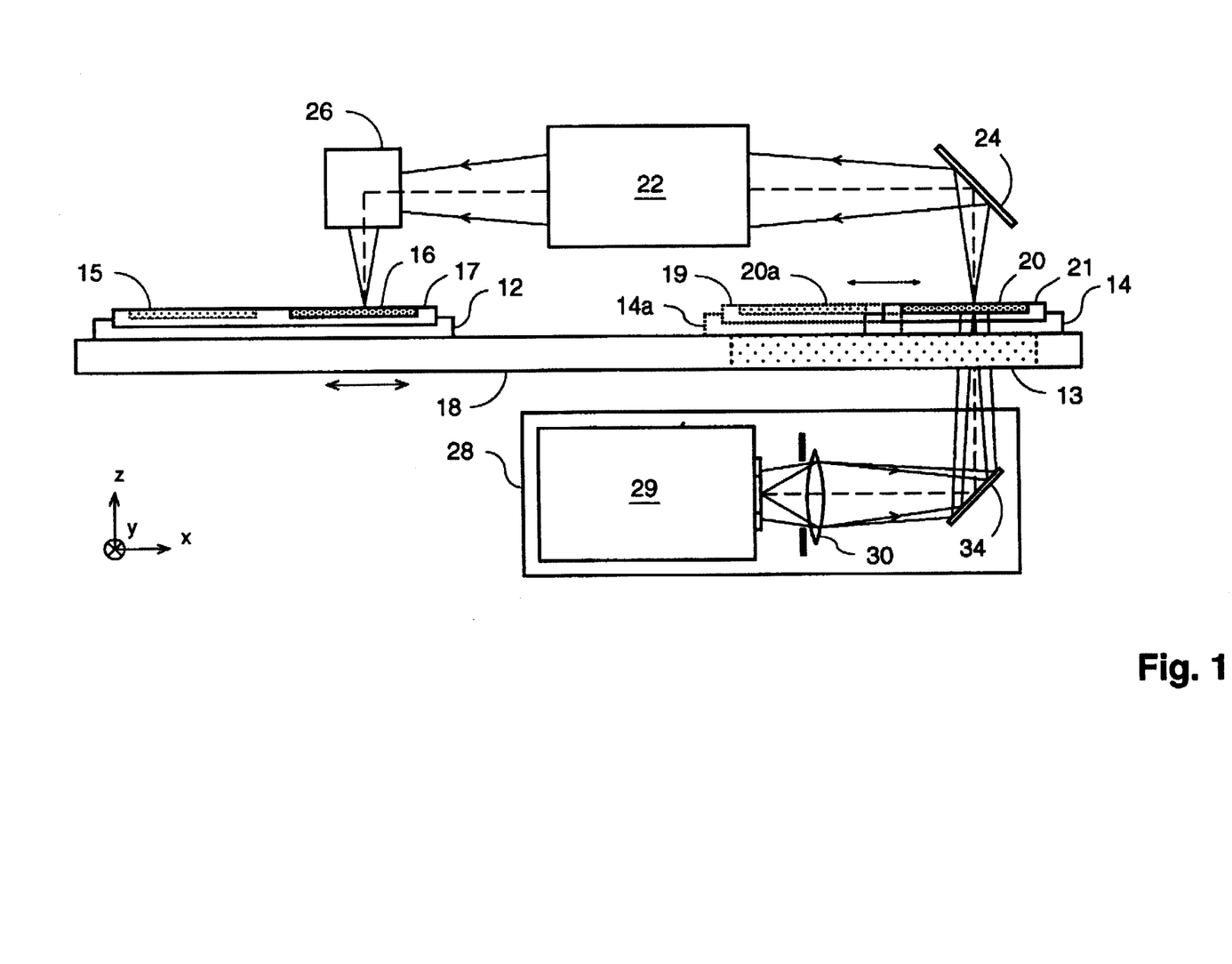
FIG. 1 is a semischematic illustration in elevation view of a first embodiment of the invention, showing imaging of a first substrate segment with a segment-size mask held by an auxiliary stage at a first position.
Figure 2:
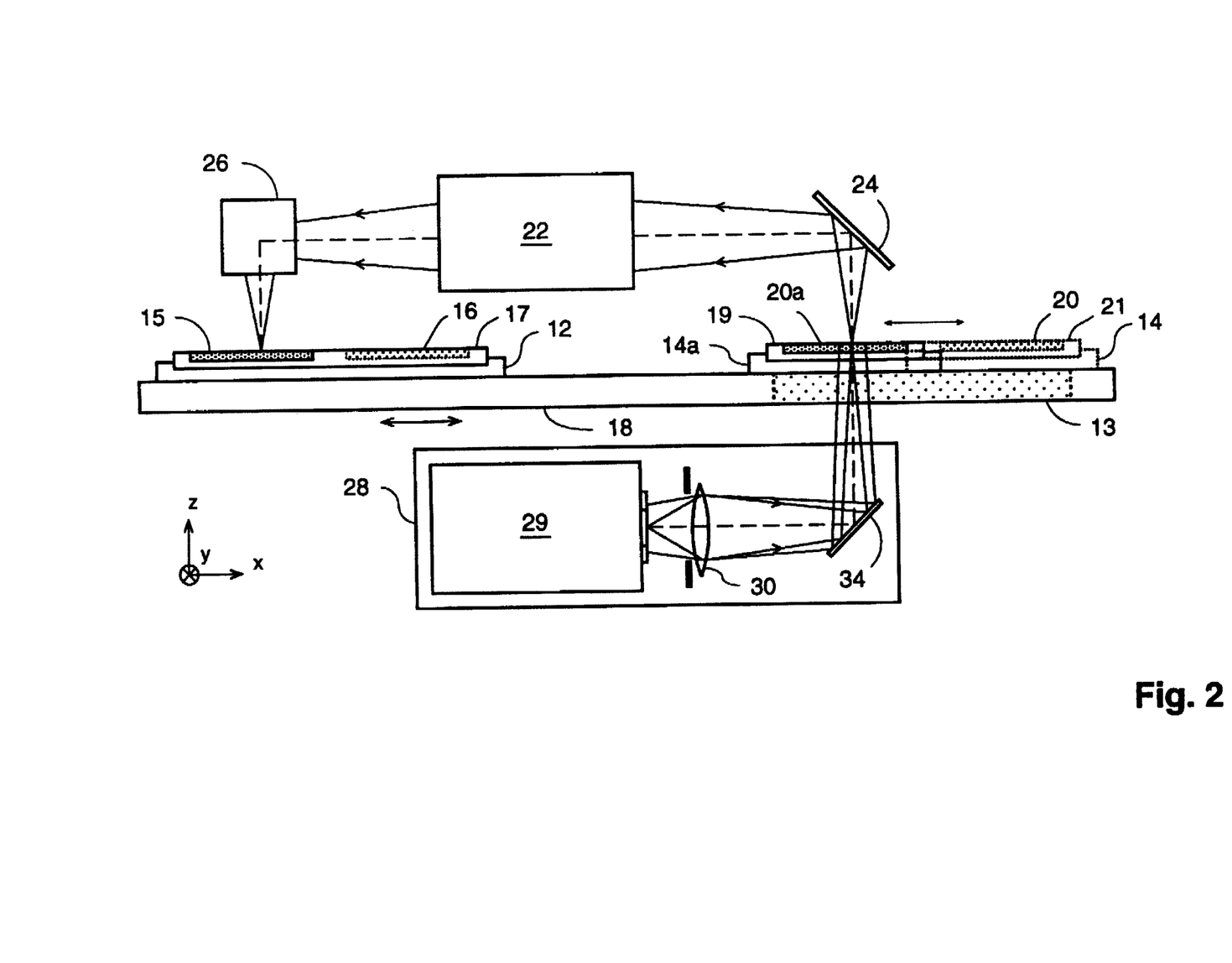
FIG. 2 is the same semischematic illustration in elevation view of the first embodiment of the invention as FIG. 1, but showing imaging of a second substrate segment with the same segment-size mask held by an auxiliary stage at a second position, while all optical imaging parameters are maintained constant.

Two embodiments of the invention are described below. FIGS. 1 and 2 illustrate the first embodiment. The substrate 17 is affixed in a substrate holder 12 which is mounted on a primary stage subsystem 18. Also situated on the primary stage subsystem 18 is an auxiliary mask stage subsystem 14 in which is mounted a mask holder 21 which holds a mask 20. The mask 20 is illuminated from below, through an opening 13 in the primary stage subsystem 18, by an illumination system 28 which consists of a light source 29 and certain auxiliary optics, partially shown in FIG. 1 as lens 30 and mirror 34. The illumination system 28 produces a polygonal, preferably hexagonal, illumination region on the mask. This illuminated mask region is imaged by a projection lens 22 on to the substrate 17. The imaging path also contains additional optical components, including a fold mirror 24 and a reversing unit 26. The substrate size is an approximate multiple of the mask size; in FIG. 1, this multiple is shown as being 2 in the longitudinal direction (x-axis, the direction of the optical axis of the projection lens). The objective is to make a 1:1 image of the whole mask 20 in each of several segments of the substrate 17, these segments being shown as 16 and 15 in FIG. 1.

To expose one segment (16) of the substrate 17, the primary stage subsystem 18 is scanned longitudinally such that the length of the mask 20 traverses across its polygonal illumination region, thereby simultaneously producing an image of the scanned mask region on a corresponding region on the substrate segment 16. After a scan, the primary stage is moved laterally by the width of a scan, and scanned again longitudinally by the length of the mask. These sequential scans are repeated until an entire substrate segment is exposed. As described in the previous patents (cited above) by this inventor, the partial overlap between adjacent hexagonal scans causes their complementary intensity profiles to add seamlessly, thereby producing a uniform, stitch-free image of the whole mask on the substrate segment 16.

Figure 3:
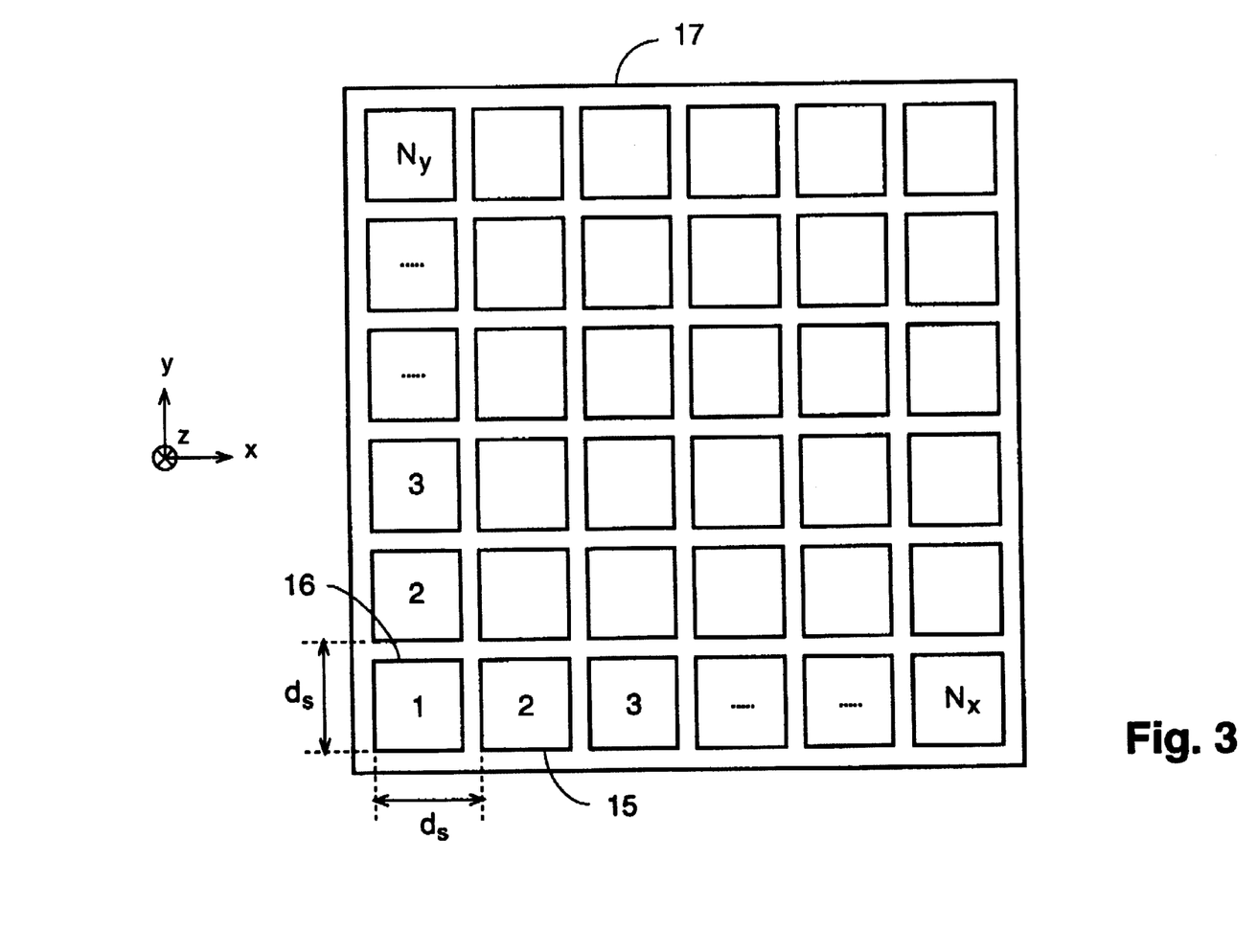
FIG. 3 is a plan diagram of a substrate showing layout of $N_x \times N_y$ segments which repeat periodically with a repetition distance $d_S$.

After a substrate segment 16 has been imaged, the auxiliary mask stage 14 is moved to position 19, which brings the mask 20 to its new location 20a, as shown in FIG. 2. The primary stage 18 is again scanned longitudinally and moved laterally as before, so that an image of the mask 20a is produced in segment 15 of the substrate 17. Note that the projection assembly (22,24,26) and the illumination assembly (28) remain stationary. Thus, by providing mask handling means comprising an auxiliary mask stage, it is possible to pattern a large substrate with 1:1 imaging using a mask that is several times smaller than the substrate, provided the substrate consists of multiple, spatially separated panel-segments, each of which is equal in size to the mask. FIG. 3 illustrates the layout of a large substrate consisting of $N_x \times N_y$ segments that are periodically arranged with a repetition distance of $d_S$.

We point out that the primary stage 18 and the auxiliary mask stage 14 are of significantly different characteristics. In order to realize high exposure throughputs, the primary stage 18 must be capable of scanning in the x-direction at a high speed. In comparison, the auxiliary stage 14 need not have high-speed scanning capability, since its sole function is to move the mask from correspondence with one substrate segment to correspondence with another substrate segment. For example, whereas the primary stage must be able to scan at a speed of 250-500 cm/sec, it is adequate for the auxiliary mask stage to be able to move at a speed of 2.5-5 cm/sec.

As a straightforward variation of the above embodiment, one may mount the substrate (instead of the mask) on an auxiliary stage. The operation of the invention in such a case will be analogous to that described above, except that now, one would move the substrate (instead of the mask) to bring different substrate segments to the imaging location.

Figure 4:
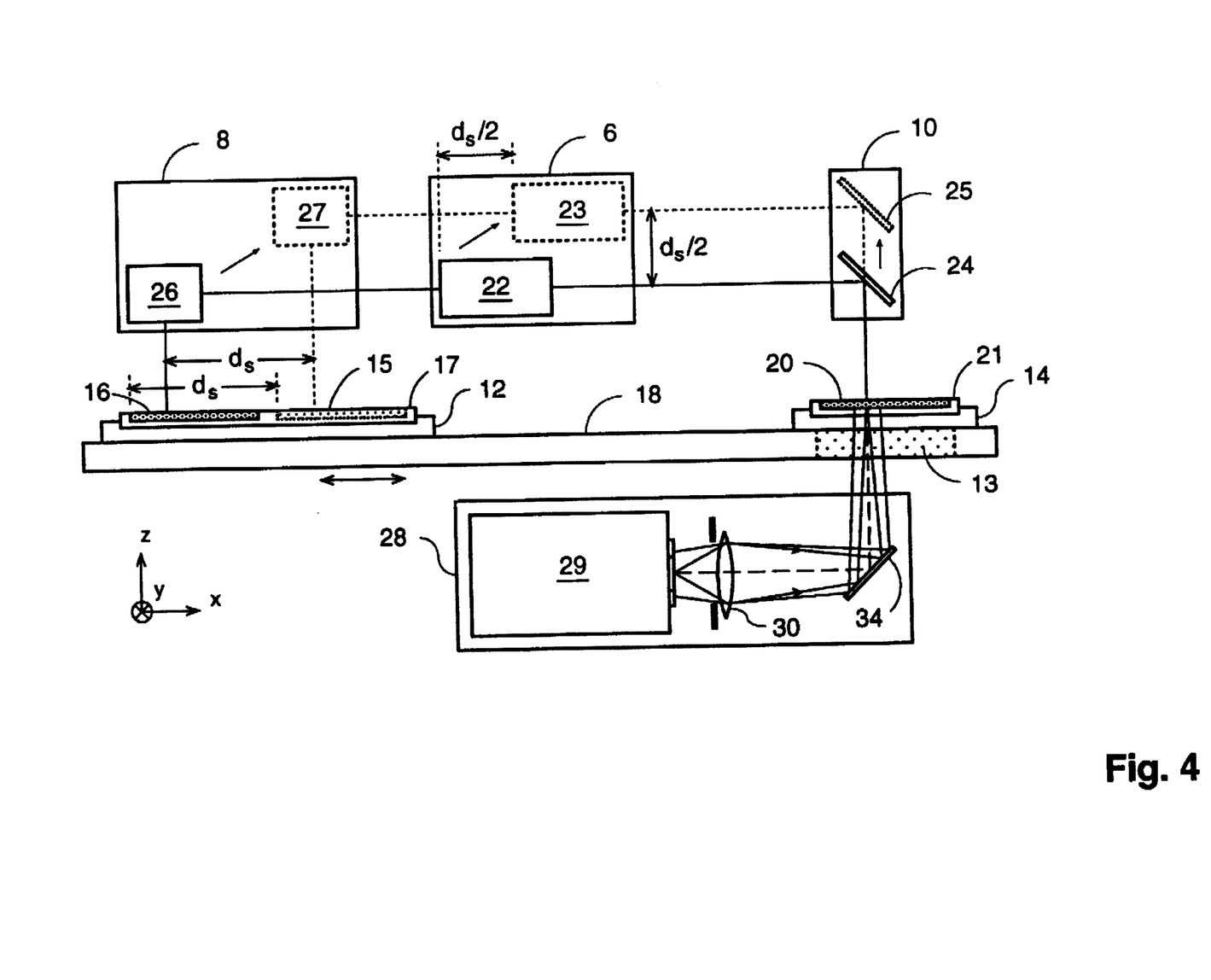
FIG. 4 is a semischematic illustration in elevation view of a second embodiment of the invention, showing imaging of a first substrate segment with a segment-size mask with imaging components in their first set of positions, and also showing, in dotted lines, imaging of a second substrate segment with the same segment-size mask with imaging components in their second set of positions, with all optical imaging parameters remaining constant.

A second embodiment of the invention is shown in FIG. 4. The mask 20 with its holder 21 is mounted as before on an auxiliary mask stage 14, but it does not move along the x-axis. Instead, movement of the imaging optics is employed to shift the image location from substrate segment 16 to segment 15. The projection lens 22, the reverser assembly 26 and the fold mirror 24 are mounted on auxiliary optics stages 6, 8 and 10, respectively. The substrate 17 is mounted as before in FIG. 1. Also as before, the primary stage 18 is scanned longitudinally and moved laterally to produce a seamless image of mask 20 on the segment 16 of the substrate 17. After the exposure of the segment 16 has been completed, the auxiliary stages 6, 8 and 10 move the projection lens 22, the reverser assembly 26 and the fold mirror 24 to their new positions 22a, 26a and 24a;

respectively, following which the primary stage 18 is again scanned longitudinally and moved laterally to produce a seamless image of mask 20 on the segment 15 of the substrate 17. These new positions of the projection lens 22a, reverser assembly 26a and fold mirror 24a are determined as follows. As previously illustrated in FIG. 3, $d_s$ is distance from an edge of the substrate segment 16 to the corresponding edge of the substrate segment 15. Then the new position 26a of the reverser is obtained by moving from position 26 along the x-direction by a distance $d_S$ and along the z-direction by a distance $d_S/2$. The new position 22a of the projection lens is obtained by moving along both x- and z-directions by a distance $d_S/2$, and the new position 24a of the fold mirror 24 is obtained by moving only along the z-direction by a distance $d_S/2$. When the new positions are determined by the above algorithm, the object distance from the lens 22a to the mask 20 remains the same as the distance from the lens 22 to the mask 20 and the image distance from the lens 22a to the substrate segment 15 remains the same as the distance from the lens 22 to the substrate segment 16. Thus, all the imaging parameters (object distance, image distance, track length and numerical aperture) for patterning of the segment 15 remain identical to those for the segment 16.

FIG. 1 shows box 40, which is a control means to operatively interrelate the stage subsystem (18), the illumination subsystem (28), the projection subsystem (22–26) and the image location shifting means to provide additive illumination in certain overlap regions of areas exposed by adjacent strip scans of each substrate segment such that the effect of the exposure dose delivered in the overlap regions is seamless and the effect of the exposure dose delivered across each entire substrate segment is uniform.

Figure 5:
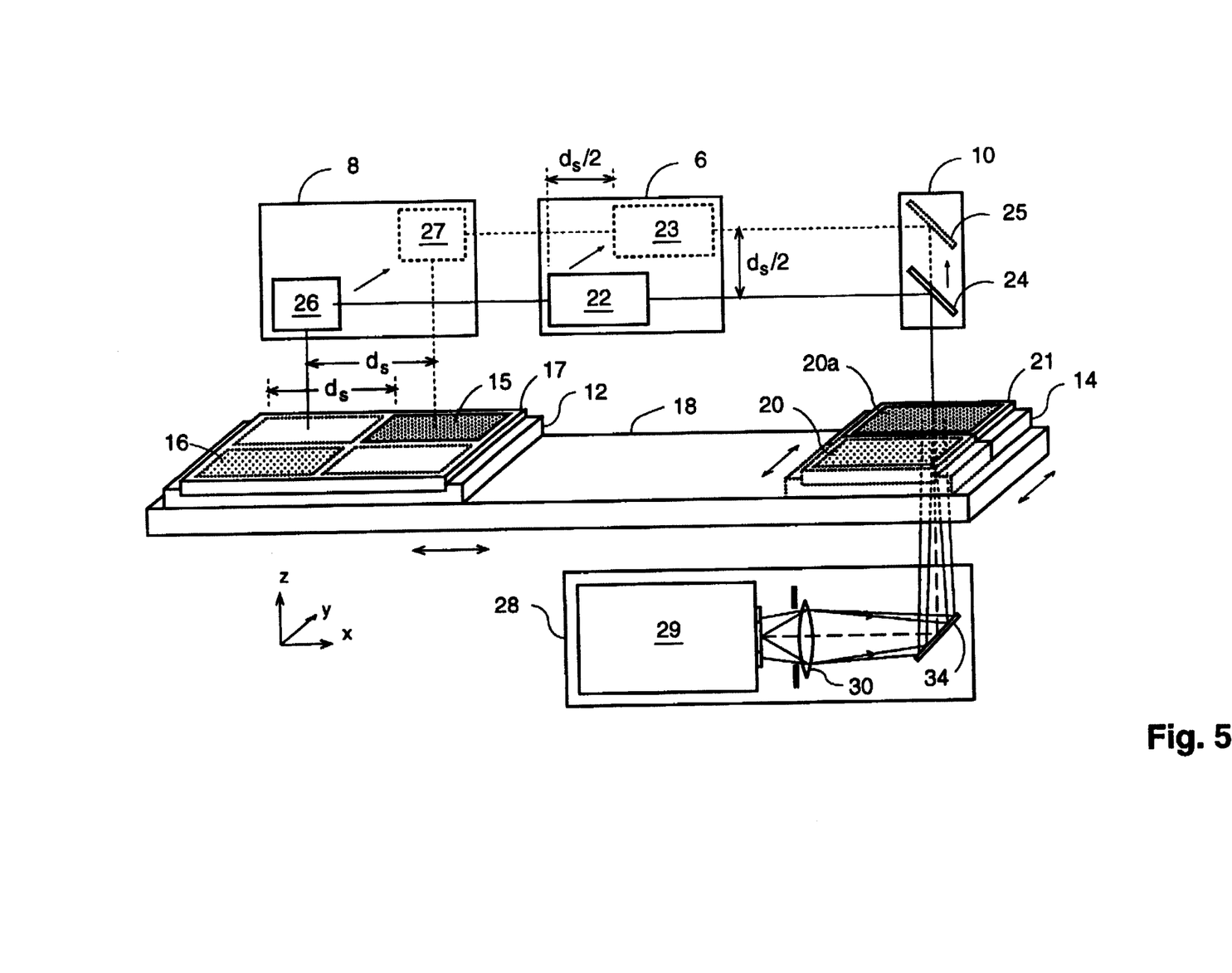
FIG. 5 is a semischematic illustration in perspective view of a third embodiment of the invention, a composite of the first and second embodiments, showing imaging of a first substrate segment with a segment-size mask and imaging components at a first set of positions, and also showing imaging of a second substrate segment with the same segment-size mask, with the mask and the imaging components in their second set of positions, while all optical imaging parameters are maintained constant.

Note that the embodiment just described is capable of shifting the image location on the substrate in the x-direction. The steps of moving the imaging optics components (22,24,26) can be repeated as many times as necessary to pattern all of the $N_x$ segments of the substrate for any given y-value. To shift the image location on the substrate along the y-axis, the auxiliary mask stage 14 is stepped along y, in a manner similar to that described with reference to FIGS. 1 and 2. The stepping along y can be repeated as many times as necessary to pattern all of the $N_y$ rows of segments of the substrate. This third embodiment incorporating auxiliary stages for moving both the mask and the imaging system components is illustrated in FIG. 5. Here, the substrate segment 16 is imaged when the mask is in position 20, the projection lens in position 22, the reverser assembly in position 26 and the fold mirror in position 24. When the mask is moved by auxiliary stage 14 to position 20a, the projection lens 22a is moved by auxiliary stage 6 to position 22a, the reverser assembly 26 is moved by auxiliary stage 8 to position 26a, and the fold mirror 24 is moved by auxiliary stage 10 to position 24a, then the substrate segment 15 comes to the imaging location.

As pointed out before in connection with the auxiliary mask stage 14 of FIG. 1, the auxiliary optics stages (6, 8 and 10) for moving the imaging system components need not be high-speed stages. It is adequate for these optics stages to be able to move at speeds of 2.5–5 cm/sec.

As a practical example, a multi-chip manufacturer may wish to produce 15×15 cm modules on a 60×60 cm substrate. Whereas prior-art 1:1 seamless scanning projection patterning tools would require a mask of dimensions 60×60 cm, this invention would enable the same substrate to be patterned using a 15×15 cm mask.

The movements of the projection lens, the reverser assembly and the fold mirror will be controlled electronically and can be carried out in any sequence. For example, first the lens and the reverser may be moved along the x-direction by distances $d_S/2$ and $d_S$, respectively, after which all three components can be simultaneously moved along y by $d_S$.

Finally, we describe an embodiment that makes it possible to image different masks on different substrate segments. This is illustrated with the help of FIG. 5. Here the mask stage 14 is configured to be large enough to hold more than one mask. As an example, consider that the mask stage holds two masks, which we shall denote (in this paragraph only) as 20 and 20a. [Remember that in the previous reference to FIG. 5, 20 and 20a were identified as two different positions of one mask.] The system now will be capable of imaging either of the two masks on any of the four substrate segments. Such a multiple mask capability is a desirable feature that may be attractive in certain manufacturing applications.

Method of Operation

The invention describes a method of providing a large-area, high-throughput, high-resolution, scan-and-repeat, projection imaging system for replicating patterns present on a mask onto a substrate which includes a set of substrate segments each corresponding to the mask, having the following steps:

(a) providing a primary stage subsystem for holding in fixed juxtaposition the mask and the substrate, and capable of scanning longitudinally in one dimension, and also being capable of moving laterally in a direction perpendicular to the scan direction;

(b) providing an illumination subsystem having spectral and intensity characteristics suited for exposure of said substrate, having an effective source plane of a predetermined shape, and capable of uniformly illuminating on said mask a region of said predetermined polygonal shape;

(c) providing a projection subsystem capable of imaging said illuminated region on the mask onto a selected substrate segment, and having an image field area smaller than the substrate segment area;

(d) scanning the stage of step (a) longitudinally so that the length of said mask traverses across the illumination region of said predetermined shape described in step (b); stopping the stage momentarily after completion of a scan across the length of the mask, moving the stage by a certain distance in a direction perpendicular to the scan direction, and resuming the scanning of the stage to perform another longitudinal scan;

(e) providing additive illumination in certain overlap regions of areas exposed by adjacent scans such that the effect of the exposure dose delivered in said overlap regions is seamless and the effect of the exposure dose delivered across the entire selected substrate segment is uniform; and (f) repeating steps (d) and (e) until exposure of the entire selected substrate segment is completed;

(g) providing image location shifting means capable of causing relative movements between said mask, said substrate, components of said projection subsystem and said illumination subsystem;

(h) operating said image location shifting means to shift the location of the image of said mask from a currently selected segment on said substrate to a subsequently selected substrate segment; and (i) repeating steps (d)–(h) until exposure of all substrate segments is completed.

In one implementation of the method, the image location shifting means consists of an auxiliary mask stage mounted on the primary stage that moves the mask from one position to another so as to bring the mask in imaging alignment with different substrate segments. In another implementation of the method, the image location shifting means consists of a set of auxiliary stages for moving components of the projection optics from one set of positions to another set of positions so as to realize imaging alignment between the mask and different substrate segments. In a third implementation, auxiliary stages are used for moving both the mask and components of the projection system. Finally, the auxiliary mask stage may be configured to hold multiple masks, which then may be imaged, using the above-mentioned image location shifting means, on different substrate segments in the desired combination.

While the invention has been shown in the form of three embodiments, the foregoing and other changes in form and detail will be apparent to those skilled in the art, without departing from the spirit and scope of the invention as described in the following claims:

I claim:

1. A large-area, high-throughput, high-resolution, scan-and-repeat, projection imaging system for replicating patterns present on a mask onto a substrate, which substrate includes a set of substrate segments each corresponding to the mask, including a currently selected substrate segment and subsequently selected substrate segments, characterized by:

(a) a primary stage subsystem (18) capable of scanning in one dimension, and also being capable of moving laterally in a direction perpendicular to the scan direction so as to position itself for another scan; said stage subsystem thus being capable of exposing a selected substrate segment by configuring each substrate segment into a certain number of parallel strips, and exposing each of said strips by scanning the length of the strip across a fixed illumination region;

(b) substrate holding means (12), mounted on said stage subsystem (18), for affixing in predetermined relationship to said stage subsystem (18) a substrate (17) having a currently selected substrate segment (16) and subsequently selected substrate segments (15);

(c) mask holding means (14/21), mounted on said stage subsystem (18), for affixing a mask (20) in predetermined relationship to said stage subsystem (18) and to said substrate holding means;

(d) an illumination subsystem (28) having spectral and intensity characteristics suited for exposure of said substrate (17), having an effective source plane of a predetermined shape, and capable of uniformly illuminating on said mask (20) a region of said predetermined polygonal shape;

(e) a projection subsystem (22–26) capable of imaging said illuminated region on the mask onto said currently selected substrate segment, and having an image field area smaller than the substrate segment area;

(f) image location shifting means capable of causing relative movements between said mask (20), said substrate (17), components of said projection subsystem (22–26) and said illumination subsystem (28) so as to shift the location of the mask image from a currently selected segment on said substrate to a subsequently selected substrate segment, while keeping optical parameters constant; and (g) control means to operatively interrelate said stage subsystem (18), said illumination subsystem (28), said projection subsystem (22–26) and said image location shifting means to provide additive illumination in certain overlap regions of areas exposed by adjacent strip scans of each substrate segment such that the effect of the exposure dose delivered in said overlap regions is seamless and the effect of the exposure dose delivered across each entire substrate segment is uniform while keeping the optical imaging path length from the mask to the substrate essentially unchanged.

2. A projection imaging system according to claim 1, further characterized in that said image location shifting means (f) comprises an auxiliary mask stage subsystem (14) for moving itself to another position (14a) with respect to said primary stage subsystem (18), so as to move said mask holding means (21) and said mask (20) to another mask holding means position (19) and another mask position (20a) to present an image of said mask in its new position (20a) to a subsequently selected substrate segment (15), with alignment relationships between the new mask position (20a) and the new substrate segment (15) being identical to those between said mask (20) in its previous position and the previously selected substrate segment (16).

3. A projection imaging system according to claim 1, further characterized in that said image location shifting means (f) comprises an auxiliary substrate stage subsystem for moving said substrate holding means and said substrate to another selected position with respect to said primary stage subsystem (18), so as to present an image of said mask to a subsequently selected substrate segment (15), with alignment relationships between the mask (20) and the subsequently selected substrate segment (15) being identical to those between the mask (20) and the previously selected substrate segment (16).

4. A projection imaging system according to claim 1, further characterized in that said substrate holding means (12) has capability for holding a substrate (17) that is assigned $N_x \times N_y$ substrate segment positions (16/15), where $N_x$ is an integer that denotes the number of segments in the substrate (17) along the x-axis of the projection imaging subsystem (22–26) and $N_y$ is an integer that denotes the number of segments in the substrate (17) along the y-axis of the projection imaging subsystem (22–26); and said image location shifting means comprises an auxiliary mask stage subsystem (14) capable of moving said mask (20) so as to bring the mask in imaging alignment corresponding to a selected substrate segment from the $N_x \times N_y$ substrate segment positions.

5. A projection imaging system according to claim 1, further characterized in that said image location shifting means (f) comprises auxiliary motion subsystems (6–10) for moving components of said imaging subsystem (22–46) both parallel and orthogonally to the plane of said primary stage subsystem (18) to re-establish the same image alignment relationship between the selected mask (20) and a subsequently selected substrate segment (15) as that between the selected mask and the previously selected substrate segment (16), while keeping the optical imaging path length from the mask to the substrate essentially unchanged.

6. A large-area, high-throughput, high-resolution, scan-and-repeat, projection imaging system for replicating patterns present on a mask onto a substrate, which substrate includes a set of substrate segments each corresponding to the mask, including a currently selected substrate segment and subsequently selected substrate segments, characterized by:

(a) a primary stage subsystem (18) capable of scanning in one dimension, and also being capable of moving laterally in a direction perpendicular to the scan direction so as to position itself for another scan; said stage subsystem thus being capable of exposing each full substrate segment by configuring each substrate segment into a certain number of parallel strips, and exposing each of said strips by scanning the length of the strip across a fixed illumination region;

(b) substrate holding means (12), mounted on said stage subsystem (18), for affixing in predetermined relationship to said stage subsystem (18) a substrate (17) having a currently selected substrate segment (16) and subsequently selected substrate segments (15);

(c) mask holding means (14/21), mounted on said stage subsystem (18), for affixing a mask (20) in predetermined relationship to said stage subsystem (18);

(d) an illumination subsystem (28) having spectral and intensity characteristics suited for exposure of said substrate (17), having an effective source plane of a predetermined polygonal shape, and capable of uniformly illuminating on said mask (20) a region of said predetermined polygonal shape;

(e) a projection subsystem (22–26) capable of imaging said illuminated region on the mask onto said currently selected substrate segment, and having an image field area smaller than the substrate segment area;

(f) image location shifting means capable of causing relative movements between said mask (20), said substrate (17), components of said projection subsystem (22–26) and said illumination subsystem (28) so as to shift the location of the mask image from a currently selected segment on said substrate to a subsequently selected substrate segment; and (g) control means (40) to operatively interrelate said stage subsystem (18), said illumination subsystem (28), said projection subsystem (22–26) and said image location shifting means to provide additive illumination in certain overlap regions of areas exposed by adjacent strip scans of each substrate segment such that the effect of the exposure dose delivered in said overlap regions is seamless and the effect of the exposure dose delivered across each entire substrate segment is uniform; further characterized in that (h) said image location shifting means (f) comprises auxiliary motion subsystems (6–10) for moving components of said imaging subsystem (22–26) both parallel and orthogonally to the plane of said primary stage subsystem (18) to re-establish the same image alignment relationship between the mask (20) and a subsequently selected substrate segment (15) as that between the mask and the previously selected substrate segment (16), while keeping the optical imaging path length from the mask to the substrate essentially unchanged; and yet further characterized in that (i) said projection imaging subsystem (22–26) comprises a projection lens (22) with a magnification of 1:1, a fold mirror (24), and a reversing assembly (26) that renders the image of said mask (20) on said substrate segment (16/15) in the same orientation as the mask; and (j) means to shift the location of the image of said mask (20) from a currently selected segment (16) on said substrate (17) to a subsequently selected substrate segment (15), said auxiliary motion subsystems (6–10) for moving components of said imaging subsystem (22–26) move:

said projection lens (22) by an amount equal to $d_s/2$ parallel to the plane of said primary stage subsystem (18) algebraically toward said mask (20) and also by an amount equal to $d_s/2$ perpendicular to and algebraically away from the plane of said primary stage subsystem (18) to shift the projection lens to its subsequent position (23), said reversing assembly (26) by an amount equal to $d_s$ parallel to the plane of said primary stage subsystem (18) algebraically toward said mask (20) and also by an amount equal to $d_s/2$ perpendicular to and algebraically away from the plane of said primary stage subsystem (18) to shift the reversing assembly to its subsequent position (27), and said fold mirror (24) by an amount equal to $d_s/2$ perpendicular to and algebraically away from the plane of said primary stage subsystem (18), where $d_s$ is the periodic repetition distance between the segments (16/15) of said substrate (17).

7. A large-area, high-throughput, high-resolution, scan-and-repeat, projection imaging system for replicating patterns present on a mask onto a substrate, which substrate includes a set of substrate segments each corresponding to the mask, including a currently selected substrate segment and subsequently selected substrate segments, characterized by:

(a) a primary stage subsystem (18) capable of scanning in one dimension, and also being capable of moving laterally in a direction perpendicular to the scan direction so as to position itself for another scan; said stage subsystem thus being capable of exposing each full substrate segment by configuring each substrate segment into a certain number of parallel strips, and exposing each of said strips by scanning the length of the strip across a fixed illumination region;

(b) substrate holding means (12), mounted on said stage subsystem (18), for affixing in predetermined relationship to said stage subsystem (18) a substrate (17) having a currently selected substrate segment (16) and subsequently selected substrate segments (15);

(c) mask holding means (14/21), mounted on said stage subsystem (18), for affixing a mask (20) in predetermined relationship to said stage subsystem (18);

(d) an illumination subsystem (28) having spectral and intensity characteristics suited for exposure of said substrate (17), having an effective source plane of a predetermined polygonal shape, and capable of uniformly illuminating on said mask (20) a region of said predetermined polygonal shape;

(e) a projection subsystem (22–26) capable of imaging said illuminated region on the mask onto said currently selected substrate segment, and having an image field area smaller than the substrate segment area;

(f) image location shifting means capable of causing relative movements between said mask (20), said substrate (17), components of said projection subsystem (22–26) and said illumination subsystem (28) so as to shift the location of the mask image from a currently selected segment on said substrate to a subsequently selected substrate segment; and (g) control means (40) to operatively interrelate said stage subsystem (18), said illumination subsystem (28), said projection subsystem (22–26) and said image location shifting means to provide additive illumination in certain overlap regions of areas exposed by adjacent strip scans of each substrate segment such that the effect of the exposure dose delivered in said overlap regions is seamless and the effect of the exposure dose delivered across each entire substrate segment is uniform; further characterized in that (h) said image location shifting means (f) comprises:

an auxiliary mask stage subsystem (14) for moving itself to another position with respect to said primary stage subsystem (18), and auxiliary motion subsystems (6–10) for moving components of said imaging subsystem (22–26) both parallel and orthogonally to the plane of said primary stage subsystem (18)

so as to re-establish the same image alignment relationship between the mask (20) and a subsequently selected substrate segment as that between the mask and the previously selected substrate segment (16), while keeping the optical imaging path length from the mask to the substrate essentially unchanged.

8. A large-area, high-throughput, high-resolution, scan-and-repeat, projection imaging system for replicating patterns present on a set of masks onto a substrate, which substrate includes a set of substrate segments each corresponding to one of the masks, including a currently selected set of substrate segments and a subsequently selected set of substrate segments, characterized by:

(a) a primary stage subsystem capable of scanning in one dimension, and also being capable of moving laterally in a direction perpendicular to the scan direction so as to position itself for another scan; said stage subsystem thus being capable of exposing each full substrate segment by configuring each substrate segment into a certain number of parallel strips, and exposing each of said strips by scanning the length of the strip across a fixed illumination region;

(b) substrate holding means, mounted on said primary stage subsystem, for affixing in predetermined relationship to said primary stage subsystem a substrate having a currently selected one of a set of substrate segments and a subsequently selected one of a set of substrate segments;

(c) mask holding means, mounted on said primary stage subsystem, for affixing a set of masks in predetermined relationship to said primary stage subsystem;

(d) an illumination subsystem having spectral and intensity characteristics suited for exposure of said substrate, having an effective source plane of a predetermined shape, and capable of uniformly illuminating on said masks a region of said predetermined polygonal shape;

(e) a projection subsystem capable of imaging said illuminated region on the masks onto said currently selected set of substrate segments, and having an image field area smaller than the area of a substrate segment;

(f) image location shifting means capable of causing relative movements between said masks, said substrate, components of said projection subsystem and said illumination subsystem so as to shift the locations of the mask images from a currently selected set of segments on said substrate to a subsequently selected set of substrate segments; and (g) control means to operatively interrelate said stage subsystem, said illumination subsystem, said projection subsystem and said image location shifting means to provide additive illumination in certain overlap regions of areas exposed by adjacent strip scans of each substrate segment such that the effect of the exposure dose delivered in said overlap regions is seamless and the effect of the exposure dose delivered across each entire substrate segment is uniform.

9. The method of providing a large-area, high-throughput, high-resolution, scan-and-repeat, projection imaging system for replicating patterns present on a mask onto a substrate which includes a set of substrate segments each corresponding to said mask, characterized by the following steps:

(a) providing a primary stage subsystem for holding in fixed juxtaposition the mask and the substrate, and capable of scanning longitudinally in one dimension, and also being capable of moving laterally in a direction perpendicular to the scan direction;

(b) providing an illumination subsystem having spectral and intensity characteristics suited for exposure of said substrate, having an effective source plane of a predetermined shape, and capable of uniformly illuminating on said mask a region of said predetermined polygonal shape;

(c) providing a projection subsystem capable of imaging said illuminated region on the mask onto a selected substrate segment, and having an image field area smaller than the substrate segment area;

(d) scanning the stage of step (a) longitudinally so that the length of said mask traverses across the illumination region of said predetermined shape described in step (b); stopping the stage momentarily after completion of a scan across the length of the mask, moving the stage by a certain distance in a direction perpendicular to the scan direction, and resuming the scanning of the stage to perform another longitudinal scan;

(e) providing additive illumination in certain overlap regions of areas exposed by adjacent scans such that the effect of the exposure dose delivered in said overlap regions is seamless and the effect of the exposure dose delivered across the entire selected substrate segment is uniform; and (f) repeating steps (d) and (e) until exposure of the entire selected substrate segment is completed;

(g) providing image location shifting means capable of causing relative movements between said mask, said substrate, components of said projection subsystem and said illumination subsystem;

(h) operating said image location shifting means to shift the location of the image of said mask from a currently selected segment on said substrate to a subsequently selected substrate segment; and (i) repeating steps (d)–(h) until exposure of all substrate segments is completed.

10. The method of providing a projection imaging system according to claim 9, further characterized in that Said step (g) consists of providing an auxiliary mask stage capable of sequentially moving the mask to a position of imaging alignment with each of the segments of the substrate.

11. The method of providing a projection imaging system according to claim 10, further characterized in that said segments of the substrate are periodically arranged on the substrate with a repetition distance of $d_S$, and said step (g) consists of providing an auxiliary mask stage capable of sequentially moving the mask by a distance $d_S$ to a position of imaging alignment with each of the segments of the substrate.

12. The method of providing a projection imaging system according to claim 9, further characterized in that said step (g) consists of providing an auxiliary substrate stage capable of sequentially moving each of the segments of the substrate to a position of imaging alignment with the mask.

13. The method of providing a large-area, high-throughput, high-resolution, scan-and-repeat, projection imaging system for replicating patterns present on a mask onto a substrate which includes a set of substrate segments each corresponding to the mask, characterized by the following steps:
  (a) providing a primary stage subsystem for holding in fixed juxtaposition the mask and the substrate, and capable of scanning longitudinally in one dimension, and also being capable of moving laterally in a direction perpendicular to the scan direction;
  (b) providing an illumination subsystem having spectral and intensity characteristics suited for exposure of said substrate, having an effective source plane of a predetermined shape, and capable of uniformly illuminating on said mask a region of said predetermined polygonal shape;
  (c) providing a projection subsystem capable of imaging said illuminated region on the mask onto a selected substrate segment, and having an image field area smaller than the substrate segment area;
  (d) scanning the stage of step (a) longitudinally so that the length of said mask traverses across the illumination region of said predetermined shape described in step (b); stopping the stage momentarily after completion of a scan across the length of the mask, moving the stage by a certain distance in a direction perpendicular to the scan direction, and resuming the scanning of the stage to perform another longitudinal scan;
  (e) providing additive illumination in certain overlap regions of areas exposed by adjacent scans such that the effect of the exposure dose delivered in said overlap regions is seamless and the effect of the exposure dose delivered across the entire selected substrate segment is uniform; and
  (f) repeating steps (d) and (e) until exposure of the entire selected substrate segment is completed;
  (g) providing image location shifting means capable of causing relative movements between said mask, said substrate, components of said projection subsystem and said illumination subsystem;
  (h) operating said image location shifting means to shift the location of the image of said mask from a currently selected segment on said substrate to a subsequently selected substrate segment; and
  (i) repeating steps (d)–(h) until exposure of all substrate segments is completed; further characterized in that:
  step (g) consists of providing an auxiliary mask stage capable of sequentially moving the mask to a position of imaging alignment with each of the segments of the substrate; and still further characterized in that:
  step (g) consists of providing auxiliary motion subsystems for moving components of said projection subsystem both parallel and orthogonally to the plane of said primary stage subsystem to sequentially establish the same image alignment relationship between said mask and each of the segments of said substrate, while keeping the optical imaging path length from the mask to the substrate essentially unchanged.

14. The method of providing a projection imaging system according to claim 13, further characterized in that said segments of the substrate are periodically arranged on the substrate with a repetition distance of $d_S$;
  said projection subsystem consists of a projection lens (22), a fold mirror (24) and a reversing assembly (26); and
  step (g) consists of providing auxiliary motion subsystems for moving forward and backward said projection lens (22) by an mount equal to $d_S/2$ parallel to the plane of said primary stage subsystem toward and away from said mask and also by an amount equal to $d_S/2$ perpendicular to and toward and away from the plane of said primary stage subsystem, said reversing assembly by an amount equal to $d_S$ parallel to the plane of said primary stage subsystem toward and away from said mask and also by an mount equal to $d_S/2$ perpendicular to and toward and away from the plane of said primary stage subsystem, and said fold mirror (24) by an mount equal to $d_S/2$ perpendicular to and toward and away from the plane of said primary stage subsystem.

15. The method of providing a large-area, high-throughput, high-resolution, scan-and-repeat, projection imaging system for replicating patterns present on a mask onto a substrate which includes a set of substrate segments each corresponding to the mask, characterized by the following steps:
  (a) providing a primary stage subsystem for holding in fixed juxtaposition the mask and the substrate, and capable of scanning longitudinally in one dimension, and also being capable of moving laterally in a direction perpendicular to the scan direction;
  (b) providing an illumination subsystem having spectral and intensity characteristics suited for exposure of said substrate, having an effective source plane of a predetermined shape, and capable of uniformly illuminating on said mask a region of said predetermined polygonal shape;
  (c) providing a projection subsystem capable of imaging said illuminated region on the mask onto a selected substrate segment, and having an image field area smaller than the substrate segment area;
  (d) scanning the stage of step (a) longitudinally so that the length of said mask traverses across the illumination region of said predetermined shape described in step (b); stopping the stage momentarily after completion of a scan across the length of the mask, moving the stage by a certain distance in a direction perpendicular to the scan direction, and resuming the scanning of the stage to perform another longitudinal scan;
  (e) providing additive illumination in certain overlap regions of areas exposed by adjacent scans such that the effect of the exposure dose delivered in said overlap regions is seamless and the effect of the exposure dose delivered across the entire selected substrate segment is uniform; and
  (f) repeating steps (d) and (e) until exposure of the entire selected substrate segment is completed;
  (g) providing image location shifting means capable of causing relative movements between said mask, said substrate, components of said projection subsystem and said illumination subsystem;
  (h) operating said image location shifting means to shift the location of the image of said mask from a currently selected segment on said substrate to a subsequently selected substrate segment; and
  (i) repeating steps (d)–(h) until exposure of all substrate segments is completed. further characterized in that step (g) consists of providing:
  an auxiliary mask stage subsystem for moving itself to another position with respect to said primary stage subsystem, and
  auxiliary motion subsystems for moving components of said imaging subsystem both parallel and orthogonally to the plane of said primary stage subsystem,
  so as to re-establish the same image alignment relationship between the mask and a subsequently selected substrate segment as that between the mask and the previously selected substrate segment, while keeping the optical imaging path length from the mask to the substrate essentially unchanged.

16. The method of providing a large-area, high-throughput, high-resolution, scan-and-repeat, projection imaging system for replicating patterns present on a set of masks onto a substrate which includes a set of substrate segments each corresponding to a mask, characterized by the following steps:
  (a) providing a primary stage subsystem for holding in fixed juxtaposition the masks and the substrate, and capable of scanning longitudinally in one dimension, and also being capable of moving laterally in a direction perpendicular to the scan direction;
  (b) providing an illumination subsystem having spectral and intensity characteristics suited for exposure of said substrate, having an effective source plane of a predetermined shape, and capable of uniformly illuminating on said masks a region of said predetermined polygonal shape;
  (c) providing a projection subsystem capable of imaging said illuminated region on the masks onto a selected substrate segment, and having an image field area smaller than the area of a substrate segment;
  (d) scanning the stage of said step (a) longitudinally so that the length of a mask traverses across the illumination region of said predetermined shape described in said step (b); stopping the stage momentarily after completion of a scan across the length of the mask, moving said stage by a certain distance in a direction perpendicular to the scan direction, and resuming the scanning of said stage to perform another longitudinal scan;
  (e) providing additive illumination in certain overlap regions of areas exposed by adjacent scans such that the effect of the exposure dose delivered in said overlap regions is seamless and the effect of the exposure dose delivered across the entire selected substrate segment is uniform; and
  (f) repeating said steps (d) and (e) until exposure of the entire selected substrate segment is completed;
  (g) providing image location shifting means capable of causing relative movements between said masks, said substrate, components of said projection subsystem and said illumination subsystem;
  (h) operating said image location shifting means to shift the locations of the images of said masks from a currently selected set of segments on said substrate to a subsequently selected set of substrate segments; and
  (i) repeating said steps (d)–(h) until exposure of all substrate segments is completed.

17. A large-area patterning system utilizing a projection imaging system with mask, fold mirror, projection lens, reversing system and substrate, which substrate includes a set of substrate segments including a currently selected segment and a subsequently selected segment, comprising:
  (a) a primary stage for carrying a mounted substrate having multiple segments and a mounted mask in predetermined spatial relationship with each other and with said projection imaging system, for an imaging operation of projecting onto said currently selected substrate segment an exact image of said mask in a sequence of partially overlapping polygonal scans; and
  (b) an auxiliary stage set deployed in juxtaposition to said primary stage to present said mask and said subsequently selected substrate segment in operational relationship to said mask and to said projection imaging system, with the image parameters of object distance, image distance, track length and numerical aperture remaining the same.

18. A patterning system according to claim 17, further characterized in that:
  said primary stage is a stage capable of scanning at high speeds and said auxiliary stage set is a set of low-speed stages.

19. A patterning system according to claim 17, further characterized in that:
  said auxiliary stage set includes auxiliary stages for moving the mask and components of said projection imaging system.

20. A patterning system according to claim 17, further characterized in that it includes:
  (a) stage-on-stage mask positioning means, comprising an auxiliary stage, mounted upon said primary stage, for positioning and repositioning said mask with respect to said substrate segments; and
  (b) stage control means, for controlling said primary stage and said stage-on-stage mask positioning means to present said mask and said substrate segments in turn in operational relationship to said projection imaging system with the image parameters of object distance, image distance, track length and numerical aperture remaining the same.

21. In a large-area patterning system utilizing a projection imaging system with fold mirror, projection lens and reversing system, a primary stage for carrying a mounted substrate having a plurality of segments including a currently selected segment and a subsequently selected segment, and a mounted mask carried on an auxiliary stage on said primary stage, said projection imaging system being capable of projecting onto a substrate an exact image of the mask in a sequence of overlapping polygonal scans, the method comprising the following steps:
  a) imaging said mask on a currently selected substrate segment;
  b) moving said primary stage to place said subsequently selected substrate segment into operational position, thereby changing the mask/substrate segment distance by $d_S$, the distance between said currently selected substrate segment and said subsequently selected substrate segment; and
  c) moving said auxiliary stage by a distance of $d_S$ to present said mask and said subsequently selected substrate segment into operational relationship to said mask and to said projection imaging system with the image parameters of object distance, image distance, track length and numerical aperture remaining the same.

22. A large-area patterning system utilizing a projection imaging system with mask, fold mirror, projection lens, reversing system and substrate, which substrate includes a set of substrate segments including a currently selected segment and a subsequently selected segment, comprising:

(a) a primary stage for carrying a mounted substrate having multiple segments and a mounted mask in predetermined spatial relationship with each other and with said projection imaging system, for an imaging operation of projecting onto said currently selected substrate segment an exact image of the mask in a sequence of partially overlapping polygonal scans; and (b) an auxiliary stage set deployed in juxtaposition to said primary stage to present said mask and said subsequently selected substrate segment in operational relationship to said mask and to said projection imaging system, with the image parameters of object distance, image distance, track length and numerical aperture remaining the same; further characterized in that it includes:

(c) projection system parameter positioning means, including at least one auxiliary stage including said auxiliary stage, mounted for repositioning said projection imaging system components, fold mirror, projection lens and reversing system, with respect to said primary stage, said mounted substrate segments of said substrate and said mounted mask; and (d) control means (40) for controlling said primary stage and said projection system parameter positioning means, to present said mask and said substrate segments in turn in operational relationship to said mask and to said projection imaging system with the image parameters of object distance, image distance, track length and numerical aperture remaining the same.

\* \* \* \* \*